United States Patent [19]

Knight

[11] Patent Number: 4,862,142

[45] Date of Patent: Aug. 29, 1989

[54] CIRCUIT WITH MEMORY FOR DETECTING INTERMITTENT CHANGES IN RESISTANCE, CURRENT, VOLTAGE, CONTINUITY, POWER INTERRUPTION, LIGHT, AND TEMPERATURE

[76] Inventor: Eldon L. Knight, 1441 W. Colonial Pky., Roseville, Calif. 95661

[21] Appl. No.: 112,734

[22] Filed: Oct. 26, 1987

[51] Int. Cl.$^4$ .................. G08B 19/00; G08B 21/00
[52] U.S. Cl. .................. 340/522; 340/514; 340/650; 340/657; 340/660; 340/661; 340/662; 340/663; 340/511
[58] Field of Search ............. 340/522, 506, 508-511, 340/514, 650, 657-664; 324/133, 158 F

[56] References Cited

U.S. PATENT DOCUMENTS

| | | | |
|---|---|---|---|
| 3,641,546 | 2/1972 | Blackburn | 340/248 A |
| 3,689,832 | 9/1972 | Leto et al. | 324/65 R |
| 3,758,852 | 9/1973 | Nowell et al. | 324/78 Q |
| 3,758,855 | 9/1973 | Meyer | 324/65 R |
| 3,831,089 | 8/1974 | Pearce | 324/122 |
| 3,836,854 | 9/1974 | Wehman | 324/133 |
| 3,852,731 | 12/1974 | Hollands | 340/248 B |
| 3,911,360 | 10/1975 | Kimzey | 324/133 |
| 4,027,236 | 5/1977 | Stewart | 324/51 |
| 4,118,688 | 10/1978 | Glennon | 340/506 |
| 4,203,095 | 5/1980 | Wilson, Jr. | 340/511 |
| 4,247,849 | 1/1981 | Morris et al. | 340/660 |
| 4,250,501 | 2/1981 | Pokrandt | 340/664 |
| 4,414,539 | 11/1983 | Armer | 340/511 |
| 4,426,617 | 1/1984 | Forrestor | 324/62 |
| 4,488,110 | 12/1984 | Shirey et al. | 324/133 |
| 4,527,118 | 7/1985 | Koslar | 324/133 |
| 4,580,091 | 4/1986 | Robinson et al. | 324/51 |
| 4,634,971 | 1/1987 | Johnson et al. | 324/133 |
| 4,642,616 | 2/1987 | Goodwin | 340/654 |

OTHER PUBLICATIONS

"Radio Electronics", Nov. 1986, *Latching Continuity Tester;* Eldon L. Knight.

*Primary Examiner*—Donnie L. Crosland

[57] ABSTRACT

Electrical circuits for detecting intermittent and continuous electrical parameters such as continuity for open or closed circuits, AC power interruption or decrease in frequency, DC power interruption, missing electrical pulses; and voltage, resistance, and current levels that are greater than or less than present high and low limits. This invention also detects temperature and light (illumination) that is greater or less than present limits. The invention has a memory and both a (variable time delayed) automatic, and a manual memory reset. It provides both visual and a defeatable audio indicators or alarms. The advantage of said invention is that it detects intermittent conditions as brief as fractions of microseconds that may occur as frequently as milliseconds apart or as infrequently as days apart; it also detects steady state conditions. The invention is embodied as individual circuits capable of detecting a single parameter or as a multi-function test circuit having the capability to detecting numerous parameters. This invention is well suited to be packaged as a hand-held test instrument or as "built in" special test or monitoring circuit.

22 Claims, 6 Drawing Sheets

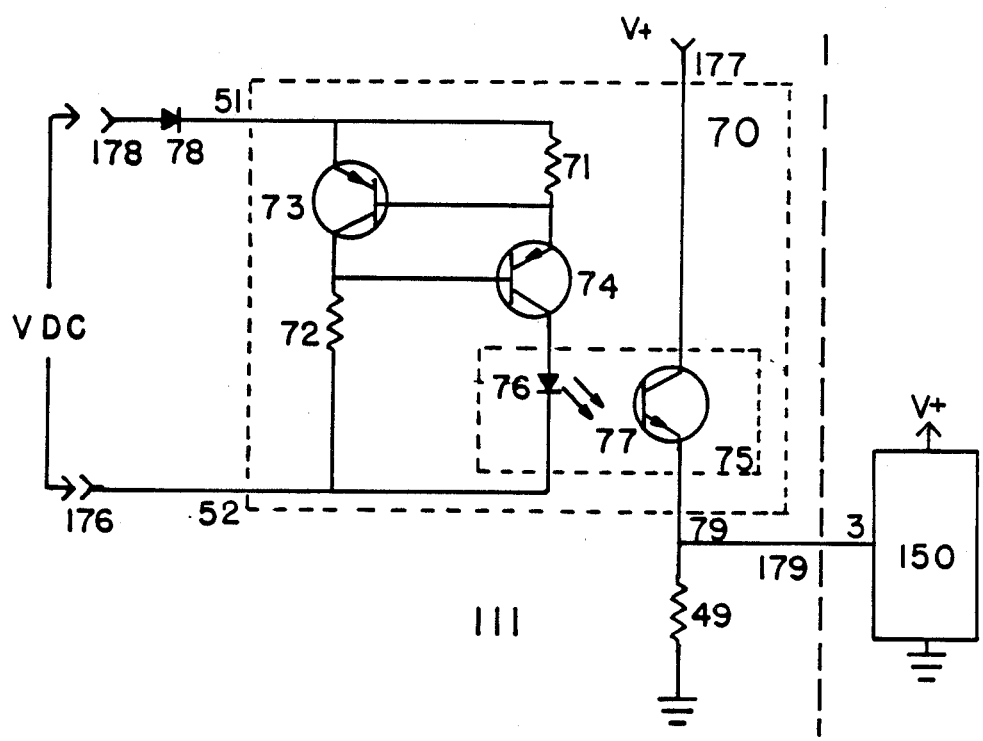
FIG. 5    300
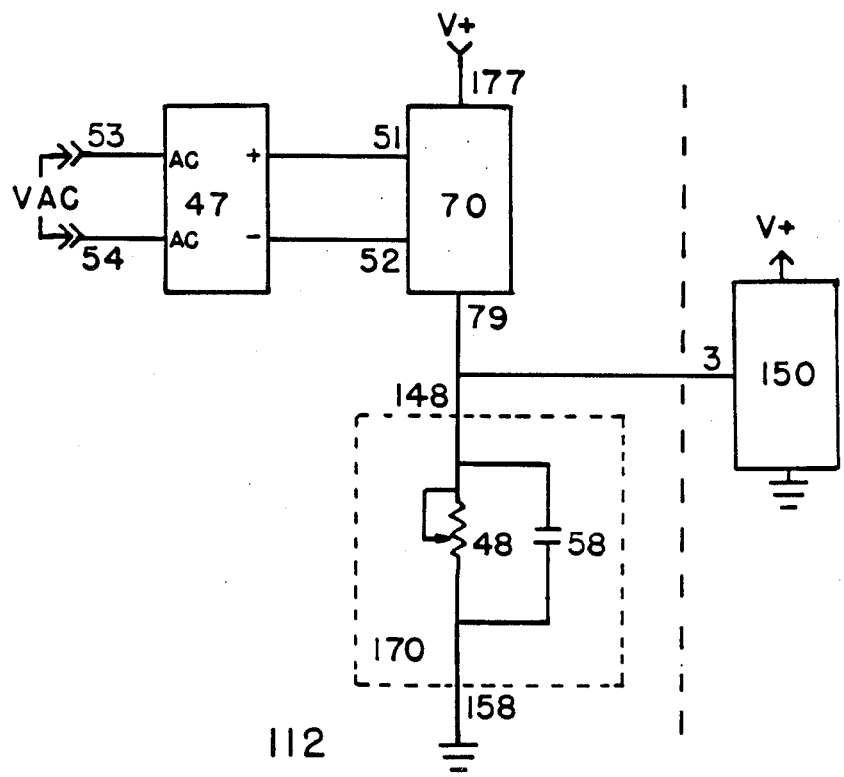
FIG. 6    400

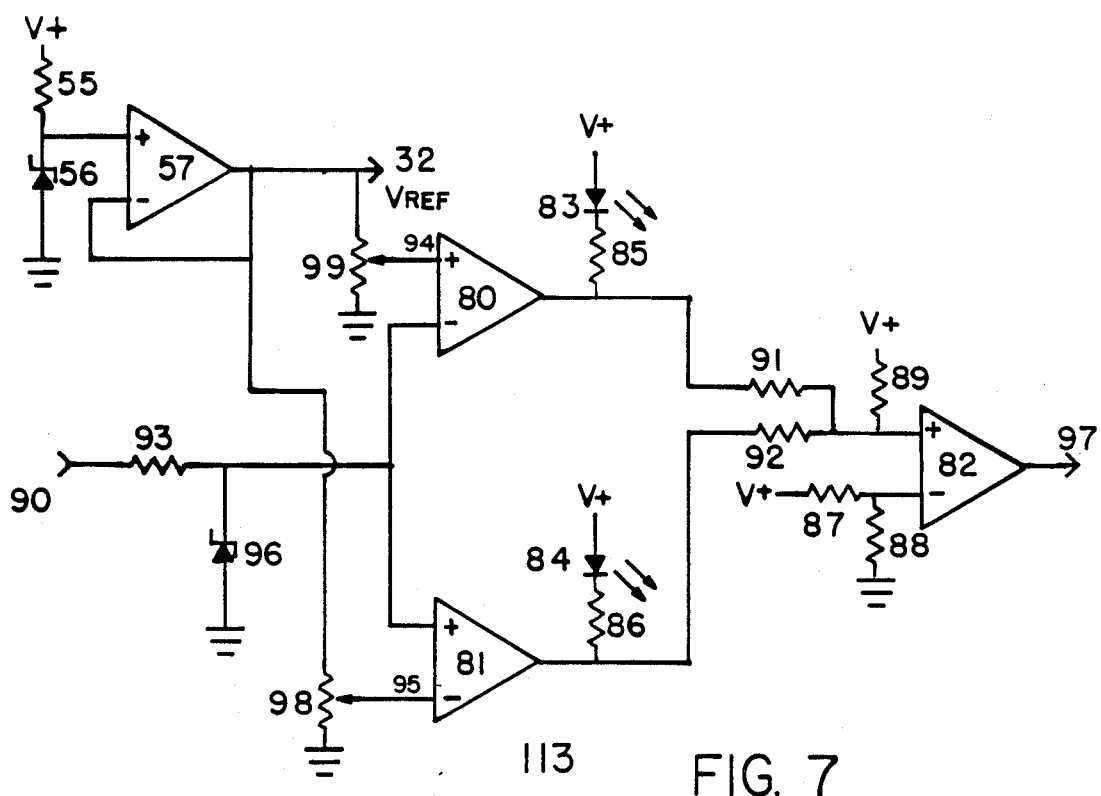
FIG. 7
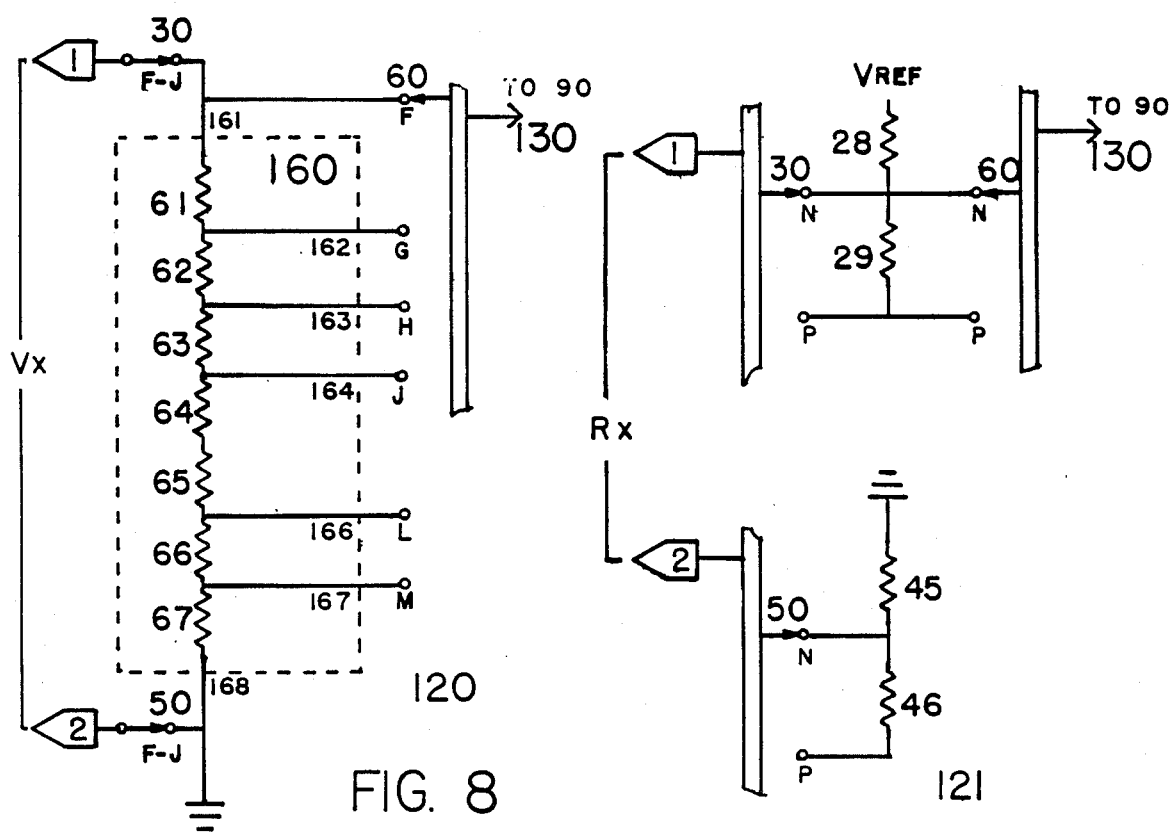
FIG. 8
FIG. 9

CIRCUIT WITH MEMORY FOR DETECTING INTERMITTENT CHANGES IN RESISTANCE, CURRENT, VOLTAGE, CONTINUITY, POWER INTERRUPTION, LIGHT, AND TEMPERATURE

BACKGROUND

1. Field of Invention

This invention relates to electrical test circuits and test instruments and specifically to circuits and instruments for detecting intermittent and continuous electrical-resistance, voltage, current, continuity, and physical parameters for detecting illumination, and temperature.

2. Prior Art

There are many electrical test instruments and circuits that are used to detect voltage, current, resistance, power interruptions, and other physical parameters such as light, and temperature.

These circuits and instruments typically utilize galvanometers, digital meters, light and, sound indicators, and cathode ray tubes. A typical multi-function meter detects electrical signals that are constant or changing slowly. An oscilloscope detects electrical signals that change rapidly and are repetitious or occurs with a period of not usually longer than several minutes. An intermittent electrical fault having a brief time duration or a physical parameter that changes rapidly but not periodically is difficult or impossible to detect with with the typical test instruments or circuits.

Most users of electrical test instrument or circuits would find desirable a device that detects intermittent electrical parameters or physical parameters that can be converted to electrical signals.

SUMMARY OF INVENTION

This invention has many unique features that are not cited in prior art. This invention consists of a primary circuit that is common to all embodiments of this invention.

The primary circuit consists of:
a. Schmitt-trigger input memory that detects fast or slow signal changes.
b. Logic level output that can be used for external control circuits.
c. Visual indicator.
d. Defeatable audio indicator with tuneable frequency.
e. Selectable manual memory reset.
f. Selectable, time delayed, automatic memory reset.
g. Indicating output that the fault detected is steady state or intermittent.

This invention utilizes numerous signal conditioning circuits, "front ends" that converts various electrical and physical parameters to logic voltage levels. These different "Front Ends" are:
1. Open circuit detector.
2. Closed or short circuit detector.
3. AC power interruption and frequency decrease detector.
4. DC power interruption detector.
5. Voltage window detector.
6. Current detector.
7. Resistance detector.
8. Temperature detector.
9. Light (illumination) detector.
10. Missing electrical pulse detector.

All or a portion of these "front ends" can be used with the primary circuit to form a multi-function test circuit, or one "front end" may be used with the primary circuit to make a special purpose (one function) test circuit.

All embodiments of this invention detects intermittent changes in the parameter being measured and provides a visual indication or alarm, and an audio indication or alarm that may be defeated. The time duration of intermittent signals that are detectable by this invention depends on the speed of response of the various "front ends" but, they are between approximately 10 milliseconds for detecting 50 Hz AC power interruption to fractions of a microsecond for the open or closed circuit detector.

A potential main use of this invention would be in detecting electrical conditions of short time duration such that standard ohm, volt, and ampere meters can not detect, and are so rare or infrequent an oscilloscope would be impractical.

OBJECTS AND ADVANTAGES

Accordingly we claim that this invention has the following objects and advantages:

It detects intermittently closed (short) circuits,
It detects intermittently open circuits,
It detects intermittent direct current electrical power interruptions,
It detects intermittent alternating current electrical power interruptions and intermittent decreases in frequency,
It detects intermittent changes in direct current voltages that are outside preset high and low limits,
It detects intermittent changes in direct current that are outside preset high and low limits,
It detects intermittent changes in resistance, that are outside preset high and low limits,
It detects intermittent changes in physical parameters such as light, and temperature that are outside preset high and low limits,
It detects intermittent conditions as brief as fractions of microseconds that, may occur as infrequently as days apart.
It also detects steady state electrical and physical parameters which are within the capability of prior art.

This invention is embodied as individual circuits capable of detecting a single parameter or as a multi-function test circuit having the capability to detect numerous parameters. This invention is well suited to be packaged as a hand-held test instrument or as a "built in" special test or monitoring circuit.

Readers will find further advantages and potential uses of the invention through considering the ensuing descriptions and drawings.

BRIEF DESCRIPTION OF DRAWINGS

FIG. 5 is a schematic of a direct current power interruption detector with memory.

FIG. 6 is a schematic of an alternating current power interruption and decrease in alternating current frequency detector with memory.

FIG. 7 is a schematic of the precision voltage window detector.

FIG. 8 is a schematic of a direct current voltage conditioning circuit.

FIG. 9 is a schematic of a resistance to voltage conditioning circuit.

DETAILED DESCRIPTION

Detailed description of a multi-function test circuit which detects electrical continuity for open or closed circuits, direct current power interruptions, alternating current power interruptions or decrease in frequency. The test circuit also detects voltages, resistances, and currents that are greater than or less than a preset window of high and low limits.

Figure 1:
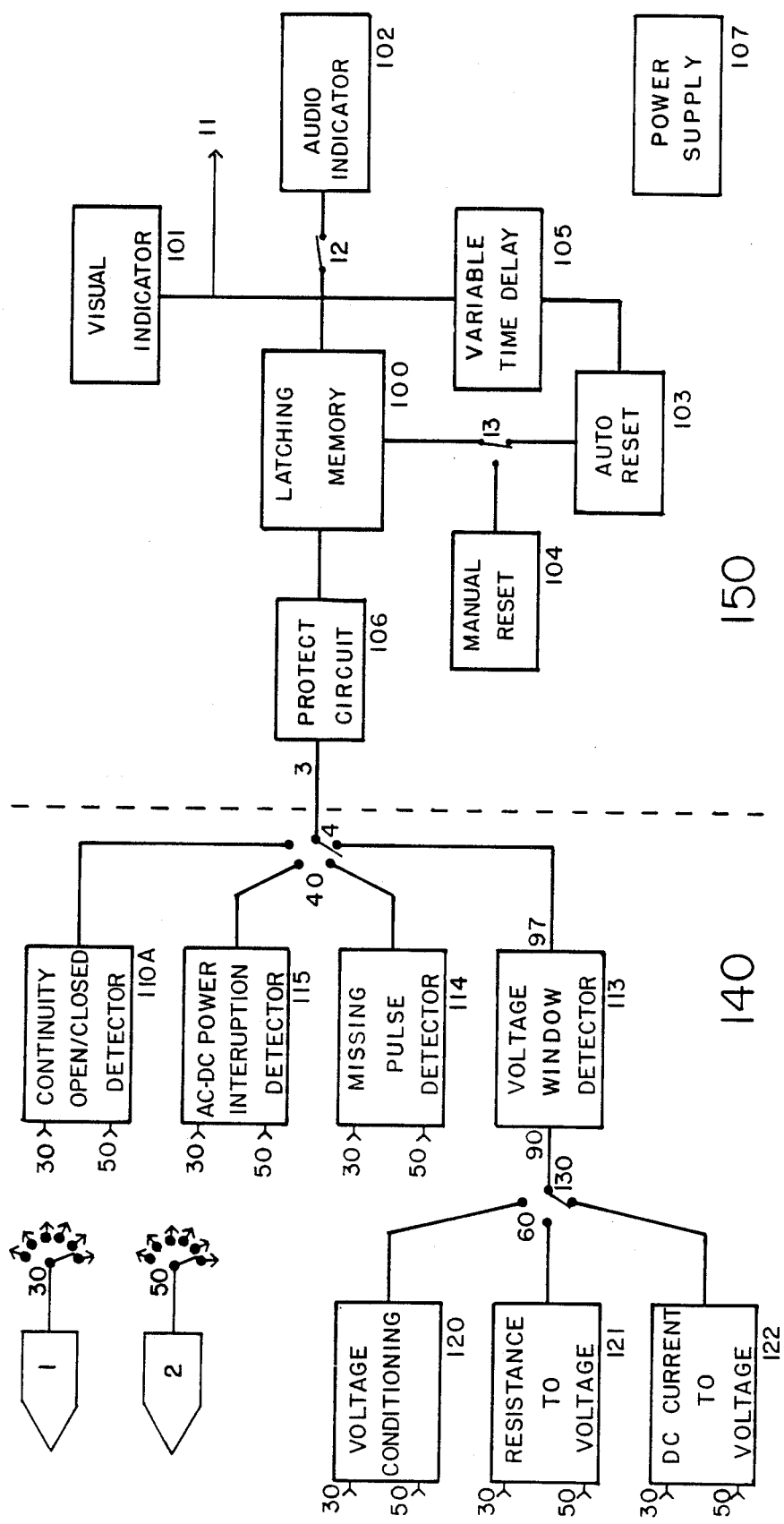
FIG. 1 is a simplified block diagram of the preferred embodiment of the invention, a multi-function test circuit.

Referring to FIG. 1, a block diagram of the preferred embodiment of this invention, circuit 180 consists of a multi-function conditioning circuit, 140 connected to circuit 150. Circuit 140 consists of input terminals 1, and 2 which are connected to the common terminals of switches 30, and 50 respectively. Multi-position outputs of switches 30, and 50 are connected to: Detector of Open or Closed Circuits 110A; Alternating Current and Direct Current Power Interruption Detector 115; Missing Pulse Detector 114; Direct Current Voltage Conditioning 120; Resistance to Voltage Conditioning 121; and Direct Current to Voltage Conditioning 122.

Figure 2:
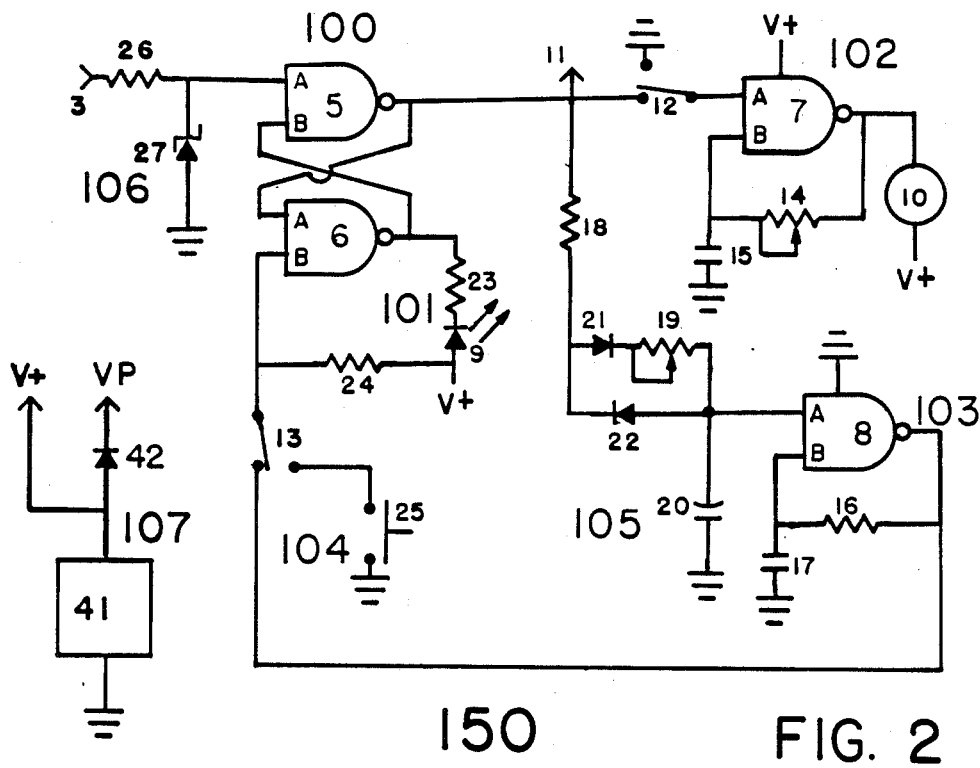
FIG. 2 is a schematic of the latching memory, memory reset, and indicating circuit.

Circuits 120, 121, and 122 connect to multi-position terminals of switch 60, the common terminal of 60 connects to output 130. Output 130 connects to input 90 of circuit 113, Voltage Window Detector Circuit. The output of circuits 110A, 114, 115, and 113 connect to the multi-position terminals of switch 40; the common terminal of switch 40 connects to output 4 and 4 connects to input 3 of circuit 150, the Latching Memory, Memory Reset, and Indicating Circuit. Complete details of circuit 150 are illustrated in FIG. 2 and described in its detailed description. Complete details of the elements of circuit 140 are included in FIG. 7 through through FIG. 13.

Detailed description of the Latching Memory, Memory Reset, and Indicating Circuit 150: Circuit 150 is common to all embodiments of this invention. Referring to FIG. 2 the input to the Latching Memory, Memory Reset, and Indicating Circuit 150; is 3 which is connected to resistor 26. Resistor 26. Resistor 26, typically 470K ohms, is connected to zener diode 27 and terminal A of logic gate 5. The combination of 26 and 27 form protect circuit 106 and is to prevent damage to 5. The reverse breakdown voltage of 27 should be with in plus or minus 0.5 volts of the power source 41. Logic gates 5,6,7, and 8 are dual input, high input impedance, NAND Schmitt trigger gates. The output of gate 5 is connected to input A of gate 6 and the output of 6 is connected to terminal B of 5, and resistor 23, this cross connected configuration of 5 and 6 form the latching memory circuit 100. The output of 5 is also connected to resistor 18 and the normally closed contacts of switch 12 and to external output terminal 11. Resistor 23 is connected to light emitting diode (LED) 9. LED 9 also connects to V+ power. Resistor 23 is typically 1–2K ohms. The combination of 23 and 9 form visual indicator circuit 101, and functionally 9 is illuminated when 100 is latched or in alarm mode.

The normally open terminal of switch 12 is connected to electrical ground. The common terminal of 12 is connected to terminal A of gate 7. The output of 7 is connected to variable resistor 14 and a piezo electric audio transducer 10. Transducer 10 is connected to power source V+. Variable resistor 14 is connected to capacitor 15. The junction of 14, and 15 connect to input B of 7, and 15 also connects to electrical ground. The combination of 7, 10, 14 and 15 form the audio indicator circuit 102. Functionally when the normally open contact of switch 12 is closed the audio indicating circuit is disabled.

Resistor 18 is connected to the anode of diode 21 and the cathode of diode 22. Variable resistor 19 is connected to the cathode of 21, the anode of 22, capacitor 20, and terminal A of logic gate 8. Capacitor 20 is typically a low leakage electrolytic type having a capacitance of 4.7 to 10 micro farads. The negative terminal of 20 is connected to electrical ground. Components 18, 19, 20, 21, 22 all form a variable time delay circuit 105. Variable resistor 19 is typically equal to greater than 1 Meg ohm. When the combined resistance of 18 and 19 is 1.5 Meg ohm and capacitor 20 is 4.7 micro farads the time delay is approximately 6 seconds.

The output of gate 8 is plurally connected to resistor 16 and the normally closed contact of switch 13. Capacitor 17 is connected to resistor 16 and to input B of gate 8. The combination of 8, 16, 17 make the automatic reset circuit, 103 which is a sub audio frequency oscillator. Resistor 16 and Capacitor 17 are selected to have a time constant of 100 to 500 milliseconds, when calculated in a manor familiar to those skilled in the art. The negative terminal of 17 is connected to electrical ground. The auto reset circuit produced low frequency pulses at approximately 2 to 10 Hz. The first pulse will reset latching memory 100 if the signal that latched it was momentary. However; if the signal that latched 100 is a continuous "low" logic level voltage, the low frequency pulses from 103 will not reset 100 and LED 9 will flash, and the audio tone of 10 will warble at the low frequency rate.

The normally open contact of switch 13 is connected to momentary switch 25 and a second contact of 25 is connected to electrical ground. Switch 25 and 13 form the manual reset circuit 104. Resistor 24 is connected to the common terminal of switch 13 and terminal B of gate 6. Resistor 24 connects to V+ which provides a logic "high" voltage to terminal B of gate 6 when neither the automatic reset or the manual reset signal is not present.

Functional description of circuit 150: When a logic "low" intermittent or steady signal is applied to input terminal 3, latching memory 100 will latch and the output of gate 5 is a logic "high" this high is present an output 11, and at input A of gate 7 when switch 12 is in the normally closed position. With a "high" at 7 an audio tone will emanate from 10 the frequency of the tone is adjusted by 14. Adjusting the audio frequency also adjusts the volume, as the acoustical efficiency of 10 is a function of the frequency. When the output of 5 is a logic "high" the output of 6 is a logic "low" an this condition causes 9 to illuminate. The output "high" from 5 also starts to charge capacitor 20 through resistors 18, 19 and diode 21. After the voltage across capacitor 20 exceeds the Schmitt trigger threshold of gate 8, the output of 8 begins to oscillate and the pulses from 8 are used to automatically reset 100 after a time delay selected by variable resistor 19 has expired.

The power supply circuit 107 consists of direct current power source 41 which is typically 9 to 12 volts. The power source positive output, V+ is connected to the anode of diode 42. The probe voltage source Vp is connected to the cathode of 42. VP and is used to power the detectors of open and closed circuits 110, 110A. Functionally diode 42 is used to isolate any external voltage, that may be accidentally applied to the test inputs, from the power source 41 and attached circuitry.

Figure 3:
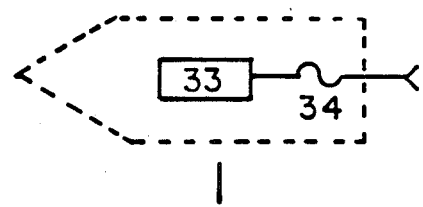
FIG. 3 is a schematic of a fused input circuit.

Detailed description of Fused Input Circuit: Referring to FIG. 3, the fused input terminal consists of input terminal 33 and fuse 34. Fuse 34 is sized to protect resistors 66, 67 in circuit 122 and is typically 2.5 amps.

Figure 4:
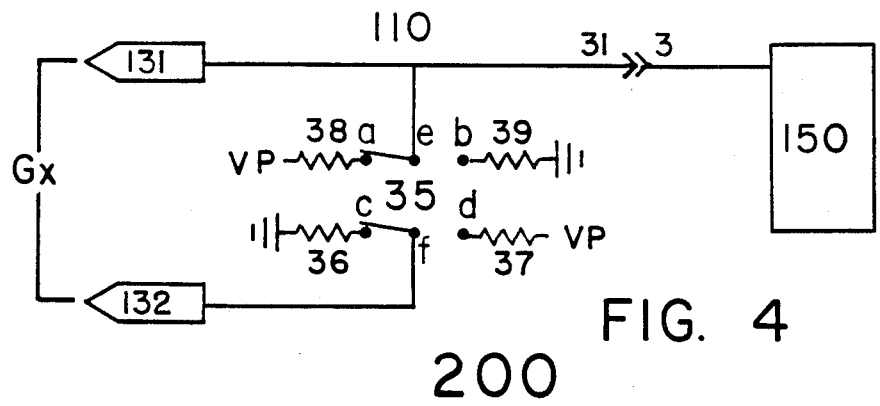
FIG. 4 is a schematic of a detector of open or closed circuits with memory.

Detailed description of the Detector of Open or Closed Circuits with memory 200: Referring to FIG. 4, circuit 200 consists of circuit 110, Detector of Open and Closed Circuits, and circuit 150, Latching Memory, Memory Reset, and Indicating circuit.

Inputs 131, and 132 are connected to the common terminals e, f respectively of switch 35. Input terminal 131 also connects to output 31 of 110, and 31 connects to input 3 of circuit 150. Resistors 38, and 37 connect to terminals a, and d of switch 35 respectively and to probe voltage Vp. Resistors 36, and 39 connect to terminals c, and b of 35 respectively, and to electrical ground. Resistors 38, 39 are typically 10K ohms, and resistors 36, 37 are typically 3K to 5K ohms.

Functional Description of circuit 110: A circuit to be tested of unknown continuity Gx is connected across terminals 131, and 132. If terminals a, c of 35 are closed and Gx is "open", output 31 is a logic "high" and there is no response in circuit 150. However, if Gx is closed or is momentarily closed for as briefly as a fraction of a microsecond output 31 is a logic "low" and the logic "low" latches the latching memory circuit, 100, of circuit 150. If the unknown circuit being tested Gx is "open" or momentarily "open" and the normally open terminals b, d are closed, output 31 is a logic "low" and circuit 100 latches, which energizes the audio and visual indicators in circuit 150.

Description of Direct Current Power Interruption Detector with Memory 300: Referring to FIG. 5, circuit 300 is the combination of circuits 111 and 150. The positive voltage input to circuits 111 is 178. Input 178 connects to the anode of diode 78 and the cathode of 78 connects to input 51 of circuit 70. The negative voltage input to circuits 111 is 176 which connects to input 52 which is the negative input to circuit 70. Input 51 connects to the emitter of transistor 73 and to resistor 71. Resistor 71 connects to the base of transistor 73 and to the emitter of transistor 74. The collector of transistor 73 connects to resistor 72 and to the base of transistor 74. The collector of transistor 74 connects to the anode of light emitting diode 76, which is a sub-component of optoisolator 75. Transistors 73 and 74 are high voltage small signal PNP transistors; typical part numbers would be 2N6520, 2N6519, or MPS-A92. The cathode of 76 is connected to resistor 72 and input 52. Input 177 connects to V+ which is supplied by circuit 150. Input 177 is connected to the photo sensitive electronic valve 77 which is a sub component to optoisolator 75. Typically 77 is a photo transistor or photodarlington-transistor. The output of 77 connects to output 79 of circuit 70. Output 79 connects to resistor 49 and 179 which is the output of circuit 111. Resistor 49 connects to electrical ground. Output 179 connects to input 3 of circuit 150.

Functionally circuit 300 detects voltage polarity of an unknown direct current power source, as well as direct current power interruptions as short as 4 microseconds. Circuit 70 combined with diode 78 makes a polarity sensitive direct current regulator that limits the current to the Light Emitting Diode (LED) 76 of optoisolator 75. Resistor 71 is a current limiting resistor and when the voltage across it begins to approach the forward biasing voltage of transistor 73, approximately 0.6 volts, then 73 begins conduct current which begins to decrease the conduction of current in transistor 74, resistor 71, and LED 76. When LED 76 illuminates, Photosensitive electronic valve 77 conducts electricity and output 179 is a logic "high". The logic "high" at 179 will, remain high for input voltages between terminals 1 and 2 of approximately 5 VDC to voltages greater than 200 VDC. If the direct current power is interrupted output 179 becomes a logic "low" and circuit 100 latches, which energizes the audio and visual indicators in circuit 150.

Description of the Alternating Current Power Interruption and Decrease in Alternating Current Frequency Detector with Memory 400: Referring to FIG. 6, circuit 400 consists of circuit 112 and 150. The inputs to circuit 112 are 53 and 54. Inputs 53, 54 are connected to the AC inputs of rectifier 47 and the +(positive) and −(negative) outputs of 47 are connected to inputs 51, and 52 respectively of 70. The circuitry of 70 is described in the detailed description of FIG. 5. V+ power is connected to 177 of 70 and is derived from the V+ power output of 150 output, 79, of 70 is connected to input 148 of 170 and to input 3 of the latching memory, memory reset, and indicating circuit 150. Circuit 170 consists of variable resistor 48 connected in parallel with capacitor 58. Input 148 of 170 connects to variable resistor 48 and capacitor 58. Input 158 of 170 connects to electrical ground, resistor 48 and capacitor 58.

Functional description of 400: Circuit 400 detects the interruption of an alternating current power source or voltage pulses and if the power or pulses are interrupted a visual and defeatable audio alarm signal is provided by the circuit. Inputs 53, 54 are to be connected to an alternating current source or pulsed power source, 47 rectifies the input signal. The electrical output 79 of 70 is positive pulses, that rapidly charge capacitor 58, resistor 48 slowly discharges 58. Resistor 48 is adjusted to where the voltage across capacitor 58 decays to the low switching threshold of gate 5, refer to FIG. 2, at a time slightly delayed from the anticipated time of arrival of the next pulse. If the second pulse is late, as in a decrease in frequency, or entirely absent; the signal at input 3 becomes a logic "low" and circuit 150 commences its alarm state. Circuit 400 will detect alternating current power interruptions shorter than one-half the period of the alternating current source. For example it will detect a power interruption of approximately 10 milliseconds for 50 Hz power or 1.25 milliseconds for 400 Hz power. Circuit 400 will also operate with direct current power and will detect power interruptions having a duration of approximately 1 millisecond.

Detailed description of Precision Voltage Window Detector 113: Referring to FIG. 7, circuit 113 uses four operational amplifiers 57, 80, 81, and 82 these operational amplifiers must have a high input impedance, and are typically packaged as a single microcircuit. Operational amplifier 57 has its output 32 connected to its inverting input forming a buffer amplifier with a voltage gain of "one". The noninverting input of 57 is connected to the junction of resistor 55 and temperature compensated precision voltage reference 56. Part number LM-329 by National Semiconductor would be a typical voltage reference source 56. Output 32 of 57 is connected to variable resistors 99, and 98. The wiper output of resistors 99, and 98 is 94, and 95 respectively and are the high and low reference voltages to operational amplifiers 80, and 81 respectively. The inverting input of 80 is connected to the noninverting input of 81 and to the junction of resistor 93 and zener diode 96. Protected input 90 connects to resistor 93 and the combination of 93, and 96 form a protection circuit to prevent damage to 80, and 81. The output of 80 connects to resistors 85 and 91. The output of 81 connects to resistors 86 and 92. The cathodes of light emitting diodes 83, and 84 connect to resistors 85, and 84 respectively. Operational amplifier 82 combined with resistors 87, 88, 89, 91, and 92 form a logic "AND" gate, which means that when both the outputs of 80, and 81 are logic, "highs" then output 97 of 82 is a logic "high". And likewise a when either output of 80, or 81 is "low" the output 97 is "low". The noninverting input of 82 is connected to resistors 89, 91, and 92. The inverting input of 82 is connected to resistors 87, and 88. Typical values of 87, 89, 91, and 92 would be 100K ohms and 88 would typically be 330K ohms. The anodes of LEDs 83, and 84 and resistors 55, 87, 89 are connected to V+ voltage. The anodes of 56, and 96; and resistors 88, 98, 99 are all connected to electrical ground.

Functional description of Precision Voltage Window Detector 113: The precision voltage window detector has a voltage window that is limited by a high reference voltage 94 and a low reference voltage 95, and if an unknown voltage at 90 being tested is within the limits of the window, the signal is considered within tolerance, and output 97 is a logic "high". However, if the unknown voltage is outside the voltage window, being either higher than the high reference voltage 94; or being lower than the low reference voltage 95, then LED 83 is illuminated indicating the signal is higher than 94; or LED 84 is illuminated if it is lower than 95. Also when the unknown voltage is outside the voltage window, output 97 is a logic "Low".

In the situation where only a high threshold is of concern the low reference voltage 95 is adjusted to its minimum limit; likewise, where only the low threshold is of concern the high reference voltage 94 is adjusted to its maximum limit.

Detailed description of Direct Current Voltage Conditioning Circuit 120: The function of circuit 120 is to divide or attenuate an unknown voltage to be measured by fixed known integer increments. Referring to FIG. 8, switches 30, 50, and 60 are multi-position switches that are mechanically connected such that when 30 is in position F switches 50 and 60 are also in position F.

Input 1 is connected to the common terminal of switch 30; terminals F, G, H, AND J are connected together and to input 161 of 160, and to terminal F of switch 60. Voltage divider circuit 160 consists of inputs 161, and 168; and resistors 61, 62, 63, 64, 65, 66 and 67 connected in series. The sum of all the divider resistance is typically 1 Meg ohm. The typical voltage outputs of 162, 163, and 165 is 20, 40, and 46 db down from the input signal at 161. These attenuations correspond to voltage divisions of 10, 100, and 200 respectively. Resistors 67, and 66 are typically 1 ohm and 9 ohm respectively. Input 2 is connected to the common terminal of switch 50. Terminals F, G, H, and J of switch 50 are all connected to electrical ground and negative input 168 of 160. Outputs 162, 163, 164, 166, 167 connect to G, H, J, L, M of 60 respectively. Output 130 connects to the common terminal of switch 60, also to protected input 90 of circuit 113 illustrated in FIG. 7.

Detailed description of the Resistance to Voltage Conditioning Circuit 121: Referring to FIG. 9 fused input 1 connects to the common terminal of switch 30. Input 2 connects to the common terminal of switch 50. Output 130 of circuit 121 connects to the common terminal of switch 60. Switches 30, 50, and 60 are mechanically connected so that when 30 is in position N, switches 50 and 60 are also in position N.

The junction of resistors 28 and 29 are connected to terminal N of switch 30 and terminal N of switch 60. Terminal P of switch 30 is connected to resistor 29 and terminal P of switch 60. Resistor 28 is connected to VREF which is supplied from circuit 113 output 32 illustrated in FIG. 7. The junction of resistors 45, 46 is connected to terminal N of switch 50. Resistor 45 is connected to electrical ground. Resistor 46 connects to terminal P of switch 50. Resistor 45 is typically 100 ohms and resistor 46 is typically 1000 ohms; these resistors are used to bias the unknown resistor under test to a higher voltage, which is a more effective range for the operational amplifiers 80, and 81 illustrated in FIG. 7. Resistors 28, and 29 are typically 3k and 6.8k respectively. However, values up to approximately 100k ohms can be used for resistor 29. Output 130 of 121 connects to protected input 90 of circuit 113 illustrated in FIG. 7.

Functionally, inputs 1 and 2 are connected across a resistive circuit Rx to be monitored. With switches 30, 50, 60 placed in position N circuit 600 is most sensitive to resistive values from 1 to 5,000 ohms and when the switches are in position P it is most sensitive to resistances from 5,000 to 45,000 ohms. Refer to FIG. 9.

Figure 10:
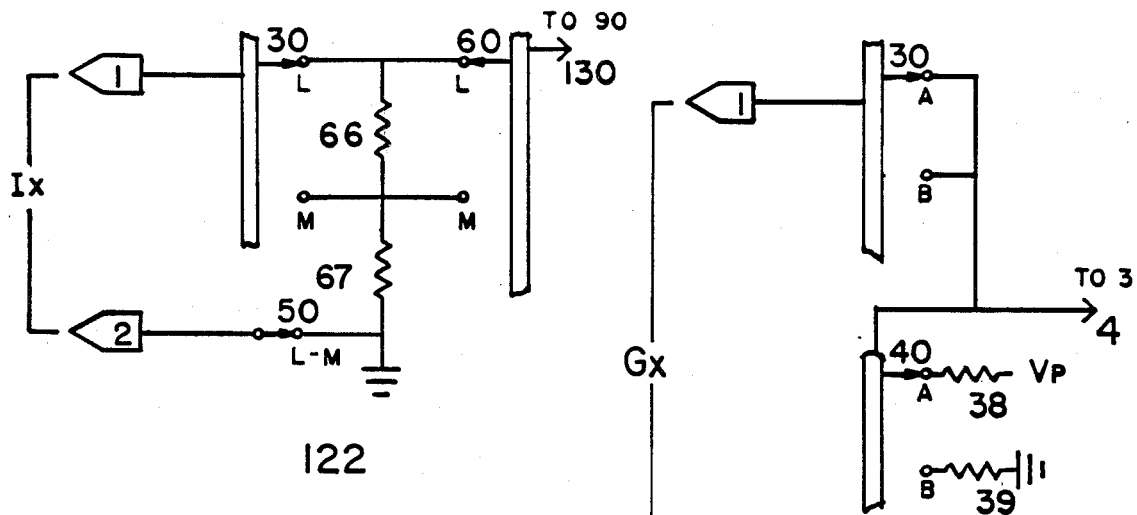
FIG. 10 is a schematic of a direct current to voltage conditioning circuit.

Detailed description of the Direct Current to Voltage Conditioning Circuit 122: Referring to FIG. 10, fused input 1 is connected to the common terminal of switch 30, and input 2 is connected to the common terminal of switch 50. Terminal L of switch 30 connects to terminal L of switch 60 and to resistor 66. Terminal M of switch 30 connects to the junction of Resistors 66 and 67; and to terminal M of switch 60. Terminals L and M of switch 50 are connected together, and to electrical ground and to resistor 67. Output 130 of circuit 122 is connected to the common terminal of switch 60. Resistors 66, 67 are current shunting resistors. Typically resistor 66 would be 9 ohms and 67 would be 1 ohm, these values would produce a 2 volt output when 200 milliamps is shunted through circuit 122 when the switches are in position L; and a 2 volt output when 2 amps are shunted through 67 when the switches are in position M. The output of circuit is connected to 90 of the Precision Voltage Window Detector 113; illustrated in FIG. 7.

Figure 11:
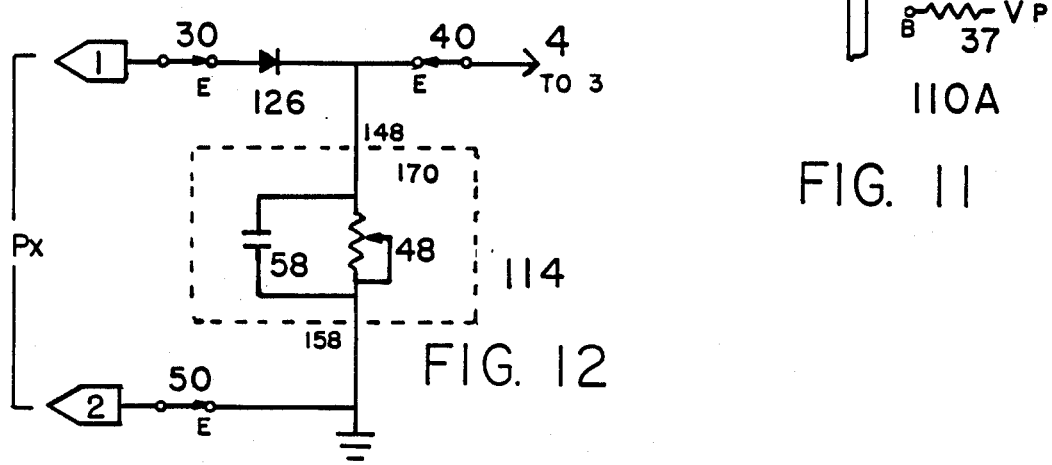
FIG. 11 is a schematic of a detector of open or closed circuits with memory configured for use in a multi-function application.

Detailed description of the Detector of Open or Closed Circuits 110A: Referring to FIG. 11, circuit 110A is electrically identical to circuit 110 illustrated in FIG. 4 the difference is that circuit 110A utilizes switching to allow it to be used with multi-function conditioning circuit, 140, as is illustrated in FIG. 1. The fused input 1 is connected to the common terminal of switch 30. Input 2 is connected to the common terminal of switch 50. Terminals A and B of switch 30 are connected together and to the common terminal of switch 40 and to output 4. Output 4 connects to input 3 of circuit 150 as is illustrated in both FIG. 1 and FIG. 2. Resistor 38, typically 10K ohms is connected to terminal A of switch 40 and to the probe voltage Vp. Resistor 39, typically 10K ohms, connects to terminal B of switch 40 and to electrical ground. Resistor 36 connects to terminal A of switch 50 and to electrical ground. Resistor 37 connects to terminal B of switch 50 and to Vp. Vp is the probe voltage from circuit 150 illustrated in FIG. 2. Resistors 36 and 37 typically have a value between 3K and 5K ohms.

Functional description of circuit 110A: A circuit of unknown continuity Gx is connected across terminals 1, and 2. If the switches 30, 40, 50 are in position A and the unknown circuit Gx is "open" output 4 is a logic "high" and there is no response in circuit 150. However, if Gx is closed or is momentarily closed for as short as a fraction of a microsecond 4 is a logic "low", which latches memory circuit, 100, of circuit 150. If the unknown circuit being tested Gx is "open" or momentarily "open" and switches 30, 40, 50 are in position B then output 4 is a logic "low" and latching memory 100 latches and the audio and visual indicators in circuit 150 are energized.

Figure 12:
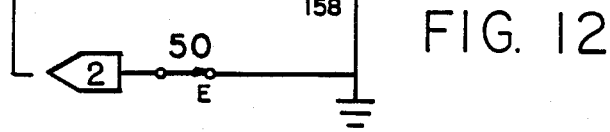
FIG. 12 is a schematic of a missing electrical pulse detector.

Detailed description of Missing Electrical Pulse Conditioning circuit 114: Referring to FIG. 12 fused input 1 and input 2 connects to the common terminals of switch 30 and 50 respectively. Terminal E of switch 30 connects to the anode of diode 126; the cathode of 126 connects to terminal E of switch 40 and to input 148 of 170. Input 148 connects to capacitor 58 and variable resistor 48. Terminal E of switch 50 connects to input 158 of 170. Input 158 connects to 48, 58, and electrical ground. Output 4 of circuit 114 connects to the common terminal of switch 40 and to input 3 of circuit 150 illustrated in FIG. 1 and FIG. 2.

Functionally circuit 114 is connected to a logic pulse or clock generating circuit Px. The pulses charge capacitor 58; diode 126 prevents discharge through input circuit, Px; The high input resistance of gate 5 of circuit 150 also prevents discharge of 58. The only discharge path is through 48, and 48 is adjusted to where the time for 58 to discharge through 48 to the lower threshold of the nand schmitt-trigger gate 5 concurs with the time of arrival of the next pulse. As long as the pulses keep charging 58, input 3 of circuit 150 remains a logic "high" and no alarm occurs. However, if a pulse is missing or is delayed the signal at 4 becomes a logic "low", which latches the latching memory in circuit 150 and the audio and visual indicators in circuit 150 are energized.

Figure 13:
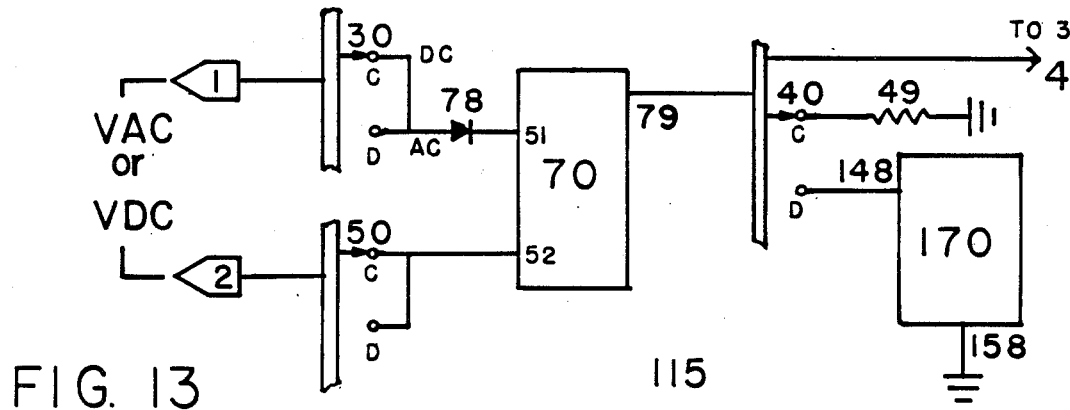
FIG. 13 is a schematic of an alternating current and direct current power interruption, and a decrease in alternating current frequency detector, configured for use in a multi-function application.

Detailed description of an Alternating Current and Direct Current Power Interruption, and a Decrease in Alternating Current Frequency Detector, 115; which is configured for multi-function application. Referring to FIG. 13 115 consists of fused input 1, and input 2 which are connected to the common terminals of switches 30, and 50 respectively. Terminals C, and D of switch 30 are connected together and to the anode of diode 78. The cathode of 78 connects to input 51 of circuit 70. Terminals C, and D of 50 connect to input 52 of 70. A complete description of circuit 70 is in the description of FIG. 5. Output 79 connects to the common terminal of switch 40 and to output 4. Output 4 connects to input 3 of circuit 150 (refer to FIG. 1). Terminal C of 40 connects to resistor 49, and 49 also connects to electrical ground. Terminal D of 40 connects to input 148 of circuit 170. Input 158 of 170 connects to electrical ground, (refer to FIG. 6 for an illustration of circuit 170).

Functionally circuit 115 detects interruption of direct current Power when switches 30, 40, and 50 are in position C and circuit 70 isolates the sensitive latching memory 100 of circuit 150 from high alternating current or direct current voltages that maybe present on terminals 1 and 2. When a direct current voltage is present output 4 is a logic "high", when no voltage is present, 4 is a logic "low". When switches 30, 40, 50 are in position D circuit 115 detects the interruption of alternating current power and a decrease in alternating current frequency. When alternating current power is interrupted or the frequency decreases beyond a threshold, output 4 is a logic "low".

Figure 14:
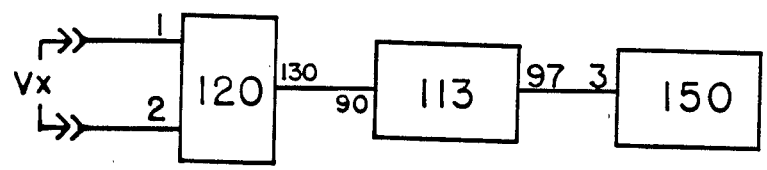
FIG. 14 is a block diagram of a precision voltage detector with memory.

Detailed description of the Precision Voltage Window Detector, with Memory. Referring to FIG. 14, Circuit 500 is the combination of circuits 113, 120, and 150. Output 130 of circuit 120 is connected to protected input 90 of circuit 113 and circuit output 97 of 113, connects to input 3 of circuit 150. Circuit 500 is a circuit that detects intermittent or steady state electrical voltages that exceeds the preset "high" and "low" voltage limits, and provides a visual indication and a defeatable audio indication that the voltage limits have been exceeded. To use circuit 500 as a precision voltage detector, the test inputs 1 and 2 are connected across an unknown voltage Vx and switches 30, 40, and 60 of circuit 120, illustrated in FIG. 8, are placed in position F for 0 db, or no attenuation of the input Vx, or position G for 20 db attenuation, or position H for 40 db attenuation, or position J for 46 db attenuation. These attenuations correspond to dividing the input signal Vx by 1, 10, 100, and 200 respectively. This signal division reduces the input signal to be with in the comparator limits of approximately 0.0 volts to 6.8 volts. The high and low thresholds are adjusted to the tolerance limits acceptable thus calibrating the circuit.

Figure 15:
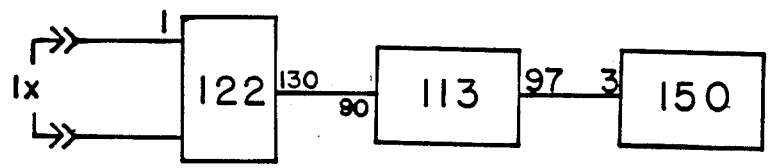
FIG. 15 is a block diagram of a precision current detector with memory.

Detailed description of the Precision Current Detector, with Memory. Referring to FIG. 15, Circuit 600 is a circuit that detects intermittent or steady state electrical currents that exceeds the preset "high" and "low" current limits, and provides a visual indication and a defeatable audio indication that the current limits have been exceeded. Circuit 600 consists of circuit 122 which is connected to protected input 90 of circuit 113 and output 97 of 113 connects to input 3 of circuit 150.

Functionally, inputs 1 and 2 are connected in series with the circuit whose current is to be monitored. With switches 30, 50, 60 of circuit 122, placed in position L circuit 600 detects currents from 0 to 200 milliamps. Refer to FIG. 10. And when switches 30, 50, 60 are in position M it detects currents from 0 to 2.0 amps.

Figure 16:
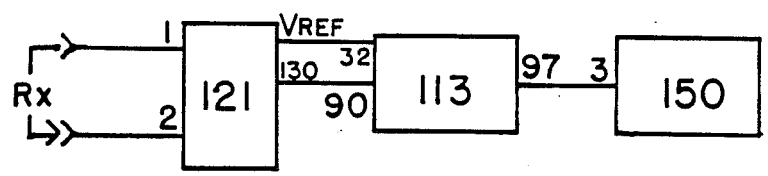
FIG. 16 is a block diagram of a precision resistance detector with memory.

Detailed description of the Precision Resistance Detector, with Memory. Referring to FIG. 16, Circuit 700 is a circuit that detects intermittent or steady state resistance changes that exceeds a preset "high" and "low" resistance limits, and provides a visual indication and a defeatable audio indication that the resistance limits have been exceeded. Circuit 700 consists of circuit 121 which is connected to protected input 90 of circuit 113 and the output 97 of 113 connects to input 3 of circuit 150. Output 32 of 113 connects to Vref of 121.

Calibration of circuit 700 is achieved by substituting Rx with a standard resistance equal to what is acceptable as the high resistance value and adjusting resistor 99 in circuit 113 to where LED 83 just begins to illuminate. To set the lower threshold substitute Rx with a standard resistance equal in value to what is acceptable as the low resistance limit, then adjust resistor 98 in circuit 113 to where LED 84 just begins to illuminate. Refer to FIG. 7.

Figure 17:
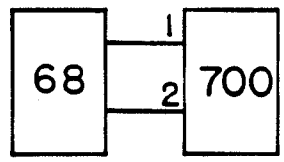
FIG. 17 is a block diagram of a precision temperature detector with memory.

Detailed description of the Precision Temperature Detector, with Memory. Referring to FIG. 17, Circuit 800 is a circuit that detects intermittent or steady state temperatures that exceeds the preset "high" and "low" temperature limits, and provides a visual indication and a defeatable audio indication that the temperature limits have been exceeded. Circuit 800 consists of a thermal sensitive resistive device 68 connected to circuit 700. By selection of a thermal sensitive resistive device 68 for specific applications circuit 800 can detect and provide alarm indications and logic level output signals from output 11 (refer to FIG. 2) for very small temperature changes as small as fractions of a degree or for very large changes of 100 plus degrees.

Figure 18:
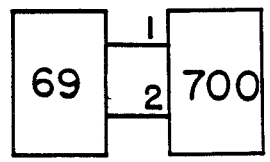
FIG. 18 is a block diagram of a precision light (illumination) detector with memory.

Detailed description of the Precision Light (Illumination) Detector, with Memory. Referring to FIG. 18, Circuit 900 is a circuit that detects intermittent or steady state Light conditions that exceeds the preset "high" and "low" illumination limits, and provides a visual indication and a defeatable audio indication that the illumination limits have been exceeded. Circuit 900 consists of light sensitive photoresistor 98 connected to circuit 700.

What is claimed is:

1. An electronic test circuit for use as a built in test circuit or as an independent test apparatus that detects intermittent or continuously open circuits; or intermittent or continuously closed electrical circuits and provides an audio and a visual indication when a fault is detected:

said electronic test circuit comprises:
a detector means, a memory means, a power supplying means, and
a means for connecting said detector means to units under test;
said power supplying means comprises:
an electrical ground output, a main power output, a protected power output, and means for connecting said electrical ground output to both said detector means and said memory means, and a means for connecting said protected power output to the detector means, and a means of coupling said main power output to the memory means;
the detector means comprises:
a means for detecting open circuits, a means for detecting closed circuits, a means for selectively selecting either said means for detecting open circuits or said means for detecting closed circuits, a means for coupling said means for selectively selecting either the means for detecting open circuits or the means for detecting closed circuits to said units under test, and a means for selectively coupling either the means for detecting open circuits or the means for detecting closed circuits to an output, and a means for coupling said output to the memory means;
whereby the output is a logic LOW signal when the unit under test is in a failed open state, or the output is a logic HIGH signal when the unit under test is in a non failed closed state, when the means for detecting open circuits is selected;
whereby, likewise; the output is a logic LOW signal when the unit under test is in a failed closed state, or the output is a logic HIGH signal when the unit under test is in a non failed open state, when the means for detecting closed circuits is selected;
the memory means comprises:
a latching memory means having a first input for setting said latching memory means, a second input for resetting the latching memory means, and a digital output means;
a means for connecting said first input to a protection means so as to protect the latching memory means from high voltages that could accidentally be present at said unit under test; a means for coupling said protection means to the output means of the detector means;
a means for connecting said digital output means to a visual indicator means, and to an audio indicator enabling-disabling means, and to a variable time delay means, and to an external output means;
whereby when the digital output means is a digital logic HIGH, said visual indicator means illuminates;
a means for coupling said variable time delay means to an automatic reset means;
a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;
said automatic reset means comprises a means for resetting said latching memory means, and a means for flashing said visual indicator means;
a means for coupling said audio indicator enabling-disabling means to an audio indicator means which has a means for varying audio frequency;
whereby when the digital output means changes from a digital logic LOW to a logic HIGH, the variable time delay means commences a timing sequence such that at the end of a user adjustable time interval the automatic reset means begins to produce pulses, said pulses are used to reset the latching memory means;
whereby when the digital logic output means is a logic HIGH and the audio indicator enabling-disabling means is in an enabling mode said audio indicator means produces a audio tone of adjustable frequency;
whereby when the signal present at the first input means is a continuous logic LOW, the latching memory means is in a set condition and when the second input means receives reset pulses from the automatic reset means after a variable time delay, the latching memory means continues to remain in said set condition and the visual indicator means flashes and said audio indicator tone warbles.

2. An electronic test circuit for use as a built in test circuit or as an independent test apparatus, that detects intermittent or continuous interruption of direct current electrical power, and provides a visual and a defeatable audio indication;

said electronic test circuit comprises:
a DC detector means, a means for coupling said DC detector means to a memory means, a means for coupling the DC detector means to units under test, and a power supplying means;

said power supplying means comprises:
an electrical ground output, a main power output, a protected power output, and means for connecting said electrical ground output to both the DC detector means and said memory means, and a means for connecting said protected power output to the DC detector means, and a means of coupling said main power output to the memory means;

the DC detector means comprises:
a rectifier means, and a means for coupling said rectifier means to said units under test, and a means for coupling the rectifier means to a current regulating means, and a means for coupling said current regulating circuit to an optical isolation means and a means for coupling said optical isolation means to an output;
whereby the rectifier means protects the current regulating means from high voltages of reversed polarity derived from the units under test; and the current regulator means provides a near uniform current to the optical isolation means, and the optical isolator means is so configured such that said output is a first predetermined output if DC power of proper polarity is present, and a second predetermined output if no DC power is present or is of reversed polarity;

said memory means comprises:
a latching memory means having a first input for setting said latching memory means, a second input for resetting the latching memory means, and a digital output means;
a means for connecting said first input to a protection means so as to protect the latching memory means from high voltages that could accidentally be present at said unit under test; a means for coupling said protection means to said output of the DC detector means,
a means for connecting said digital output means to a visual indicator means, and to an audio indicator enabling-disabling means, and to a variable time delay means, and to an external output means;
whereby when the digital output means is a digital logic HIGH said visual indicator means illuminates;
a means for coupling said variable time delay means to an automatic reset means;
a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:
a means for resetting said latching memory means, and a means for flashing said visual indicator means;
a means for coupling said audio indicator enabling-disabling means to an audio indicator means which has a means for varying audio frequency;
whereby when the digital output means changes from a digital logic LOW to a logic HIGH the variable time delay means commences a timing sequence such that at the end of a user adjustable time interval the automatic reset means begins to produce pulses, said pulses are used to reset the latching memory means;
whereby when the digital logic output means is a logic HIGH and the audio indicator enabling-disabling means is in an enabling mode said audio indicator means produces a audio tone of adjustable frequency;
whereby when the signal present at the first input means is a continuous logic LOW, the latching memory means is in a set condition and when the second input means receives reset pulses from the automatic reset means after a variable time delay, the latching memory means continues to remain in said set condition and the visual indicator means flashes and said audio indicator tone warbles.

3. An electronic test circuit for use as a built in test circuit or as an independent test apparatus, that detects an intermittent or continuous interruption of alternating current (AC) electrical power; or a decrease in frequency and provides a visual and a defeatable audio indication;

said electronic test circuit comprises:
an AC detector means, a means for connecting said AC detector means to units under test, and a means for coupling the AC detector means to a memory means, and to a power supplying means, and a means for coupling said power supplying means to said memory means;

the AC detector means comprises:
a rectifier means, and a means for coupling said rectifier means to said units under test, and a means for coupling the rectifier means to a current regulating means, and a means for coupling said current regulating circuit to an optical isolation means and a means for coupling said optical isolation means to a fast charge slow discharge integration means, and a means for coupling said fast charge slow discharge integration means to an output;
whereby the rectifier means produces full wave rectified current derived from AC at the units under test; and the current regulator means provides a pulsing DC, limited so as not to exceed the capacity of the optical isolation means, and the optical isolator means and fast charge slow discharge integration means is so configured such that said output is a first predetermined output if AC power of proper frequency is present, and a second predetermined output if no AC power is present or is of a decreased frequency;

said memory means comprises:

a latching memory means having a first input for setting said latching memory means, a second input for resetting the latching memory means, and a digital output means;

a means for connecting said first input to a protection means so as to protect the latching memory means from high voltages that could accidentally be present at said unit under test; a means for coupling said protection means to said output of the AC detector means, a means for connecting said digital output means to a visual indicator means, and to an audio indicator enabling-disabling means, and to a variable time delay means, and to an external output means;

whereby when the digital output means is a digital logic HIGH, said visual indicator means illuminates;

a means for coupling said variable time delay means to an automatic reset means;

a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:

a means for resetting said latching memory means, and a means for flashing said visual indicator means;

a means for coupling said audio indicator enabling-disabling means to an audio indicator means which has a means for varying audio frequency;

whereby when the digital output means changes from a digital logic LOW to a logic HIGH, the variable time delay means commences a timing sequence such that at the end of a user adjustable time interval the automatic reset means begins to produce pulses, said pulses are used to reset the latching memory means;

whereby when the digital logic output means is a logic HIGH and the audio indicator enabling-disabling means is in an enabling mode said audio indicator means produces a audio tone of adjustable frequency;

whereby when the signal present at the first input means is a continuous logic LOW, the latching memory means is in a set condition and when the second input means receives reset pulses from the automatic reset means after a variable time delay, the latching memory means continues to remain in said set condition and the visual indicator means flashes and said audio indicator tone warbles.

4. An electronic test circuit suitable for use as a built in test circuit or as an independent test apparatus, that detects intermittent and continous voltages that are higher or lower than preset thresholds, such that when the voltage to be measured is outside of a window of said preset threshold voltages, a plurality of visual indicators and a defeatable audio indicator are activated;

said electronic test circuit, that detects intermittent and continuous voltages comprises a voltage conditioning means and a means for connecting said voltage conditioning means to units under test, and a means for connecting the voltage conditioning means to a comparator means and a means for coupling said comparator means to a memory means, the voltage conditioning means comprises:

a means for attenuating a voltage received from said unit under test, by a plurality of selectable attenuation factors;

the comparator means comprises:

a temperature stable voltage reference means, a means for coupling said temperature stable voltage reference means to a high reference voltage means and to a low reference voltage means, a means or coupling said high reference voltage means to a high comparator means, and a means for coupling said high comparator means to a high visual indicator means;

a means for coupling said low reference voltage means to a low comparator means, and a means for coupling said low comparator means to a low visual indicator means, a means for coupling the high comparator means and the low comparator means to an electrical AND circuit means, and a means for coupling said electrical AND circuit means to an output;

a means for coupling the high comparator means and the low comparator means to an input protection means, and a means of coupling said input protection means to an input, and a means of coupling said input to units under test;

whereby when said input has a higher voltage signal present than that of the high reference voltage means the high visual indicator illuminates, and the signal present at said output is a logic LOW;

whereby when said input has a lower voltage signal present than that of the low reference voltage means the low visual indicator illuminates, and the signal present at the output is a logic LOW;

whereby when said input has a voltage signal present that is less than the high reference voltage means and greater than the low reference voltage means neither the high visual indicator nor the low visual indicator illuminates and the signal at the output is a logic HIGH;

said memory means comprises:

a latching memory means having a first input for setting said latching memory means, a second input for resetting the latching memory means, and a digital output means;

a means for connecting said first input to a protection means so as to protect the latching memory means from high voltages that could accidentally be present at said unit under test, a means for coupling said protection means to said output of the comparator means;

a means for connecting said digital output means to a visual indicator means, and to an audio indicator enabling-disabling means, and to a variable time delay means, and to an external output means;

whereby when the digital output means is a digital logic HIGH, said visual indicator means illuminates;

a means for coupling said variable time delay means to an automatic reset means;

a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:
a means for resetting said latching memory means, and a means for flashing said visual indicator means;
a means for coupling said audio indicator enabling-disabling means to an audio indicator means which has a means for varying audio frequency;
whereby when the digital output means changes from a digital logic LOW to a logic HIGH, the variable time delay means commences a timing sequence such that at the end of a user adjustable time interval the automatic reset means begins to produce pulses, said pulses are used to reset the latching memory means;
whereby when the digital logic output means is a logic HIGH and the audio indicator enabling-disabling means is in an enabling mode said audio indicator means produces a audio tone of adjustable frequency;
whereby when the signal present at the first input means is a continuous logic LOW the latching memory means is in a set condition and when the second input means receives reset pulses from the automatic reset means after a variable time delay, the latching memory means continues to remain in said set condition and the visual indicator means flashes and said audio indicator tone warbles.

5. An electronic test circuit for use as a built in test circuit or as an independent test apparatus, that detects intermittent current changes or continuous currents that are higher or lower than preset thresholds, such that when the current to be measured is outside a window of said preset thresholds, a plurality of visual indicators and a defeatable audio indicator are activated;

said electronic test circuit comprises:
a current conditioning means, whereby said current conditioning means converts electrical current to voltage, a means for connecting the current conditioning means to units under test, and means for connecting the current conditioning means to a comparator means, and a means for connecting said comparator means to a memory means;

the comparator means comprises:
a temperature stable voltage reference means, a means for coupling said temperature stable voltage reference means to a high reference voltage means and to a low reference voltage means, a means or coupling said high reference voltage means to a high comparator means, and a means for coupling said high comparator means to a high visual indicator means;
a means for coupling said low reference voltage means to a low comparator means, and a means for coupling said low comparator means to a low visual indicator means, a means for coupling the high comparator means and the low comparator means to an electrical AND circuit means, and a means for coupling said electrical AND circuit means to an output;
a means for coupling the high comparator means and the low comparator means to an input protection means, and a means of coupling said input protection means to an input, and a means of coupling said input to the current conditioning means;
whereby when said input has a higher voltage signal present than that of the high reference voltage means the high visual indicator illuminates, and the signal present at said output is a logic LOW;
whereby when said input has a lower voltage signal present than that of the low reference voltage means the low visual indicator illuminates, and the signal present at the output is a logic LOW;
whereby when said input has a voltage signal present that is less than the high reference voltage means and greater than the low reference voltage means neither the high visual indicator nor the low visual indicator illuminates and the signal at the output is a logic HIGH;

said memory means comprises:
a latching memory means having a first input for setting said latching memory means, a second input for resetting the latching memory means, and a digital output means;
a means for connecting said first input to a protection means so as to protect the latching memory means from high voltages that could accidentally be present at said unit under test, a means for coupling said protection means to said output of the comparator means;
a means for connecting said digital output means to a visual indicator means, and to an audio indicator enabling-disabling means, and to a variable time delay means, and to an external output means;
whereby when the digital output means is a digital logic HIGH said visual indicator means illuminates;
a means for coupling said variable time delay means to an automatic reset means;
a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:
a means for resetting said latching memory means, and a means for flashing said visual indicator means;
a means for coupling said audio indicator enabling-disabling means to an audio indicator means which has a means for varying audio frequency;
whereby when the digital output means changes from a digital logic LOW to a logic HIGH the variable time delay means commences a timing sequence such that at the end of a user adjustable time interval the automatic reset means begins to produce pulses, said pulses are used to reset the latching memory means;
whereby when the digital logic output means is a logic HIGH and the audio indicator enabling-disabling means is in an enabling mode said audio indicator means produces a audio tone of adjustable frequency;

whereby when the signal present at the first input means is a continuous logic LOW the latching memory means is in a set condition and when the second input means receives reset pulses from the automatic reset means after a variable time delay, the latching memory means continues to remain in said set condition and the visual indicator means flashes and said audio indicator tone warbles.

6. An electronic test circuit suitable to be used as a built in test circuit or as an independent test apparatus, that detects intermittent resistances changes or continuous resistances that are higher or lower than preset thresholds, such that when the resistance to be measured is outside a window of said preset thresholds, a plurality of visual indicators and a defeatable audio indicator are activated;

said electronic test circuit comprises:
  a resistance conditioning means, whereby said resistance conditioning means converts resistance to electrical voltage, a means for connecting the resistance conditioning means to units under test, and means for connecting the resistance conditioning means to a comparator means, and a means for connecting said comparator means to a memory means;
the comparator means comprises:
  a temperature stable voltage reference means, a means for coupling said temperature stable voltage reference means to a high reference voltage means and to a low reference voltage means, a means or coupling said high reference voltage means to a high comparator means, and a means for coupling said high comparator means to a high visual indicator means;
  a means for coupling said low reference voltage means to a low comparator means, and a means for coupling said low comparator means to a low visual indicator means, a means for coupling the high comparator means and the low comparator means to an electrical AND circuit means, and a means for coupling said electrical AND circuit means to an output;
  a means for coupling the high comparator means and the low comparator means to an input protection means, and a means of coupling said input protection means to an input, and a means of coupling said input to the resistance conditioning means;
  whereby when said input has a higher voltage signal present than that of the high reference voltage means the high visual indicator illuminates, and the signal present at said output is a logic LOW;
  whereby when said input has a lower voltage signal present than that of the low reference voltage means the low visual indicator illuminates, and the signal present at the output is a logic LOW;
  whereby when said input has a voltage signal present that is less than the high reference voltage means and greater than the low reference voltage means neither the high visual indicator nor the low visual indicator illuminates and the signal at the output is a logic HIGH;
said memory means comprises:
  a latching memory means having a first input for setting said latching memory means, a second input for resetting the latching memory means, and a digital output means;
  a means for connecting said first input to a protection means so as to protect the latching memory means from high voltages that could accidentally be present at said unit under test, a means for coupling said protection means to said output of the comparator means;
  a means for connecting said digital output means to a visual indicator means, and to an audio indicator enabling-disabling means, and to a variable time delay means, and to an external output means;
  whereby when the digital output means is a digital logic HIGH said visual indicator means illuminates;
  a means for coupling said variable time delay means to an automatic reset means;
  a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;
said automatic reset means comprises:
  a means for resetting said latching memory means, and a means for flashing said visual indicator means;
  a means for coupling said audio indicator enabling-disabling means to an audio indicator means which has a means for varying audio frequency;
  whereby when the digital output means changes from a digital logic LOW to a logic HIGH the variable time delay means commences a timing sequence such that at the end of a user adjustable time interval the automatic reset means begins to produce pulses, said pulse are used to reset the latching memory means;
  whereby when the digital logic output means is a logic HIGH and the audio indicator enabling-disabling means is in an enabling mode said audio indicator means produces a audio tone of adjustable frequency;
  whereby when the signal present at the first input means is a continuous logic LOW, the latching memory means is in a set condition and when the second input means receives reset pulses from the automatic reset means after a variable time delay, the latching memory means continues to remain in said set condition and the visual indicator means flashes and said audio indicator tone warbles.

7. A temperature sensing circuit, that detects intermittent temperature changes or continuous temperatures that are higher or lower than preset thresholds, such that when the temperature to be measured is outside a window of said preset thresholds, a plurality of visual indicators and a defeatable audio indicator are activated;

said temperature sensing circuit comprises:
  a temperature sensing element, whereby said temperature sensing element converts temperature to resistance, and a means for coupling the temperature sensing element to a resistance conditioning means, whereby said resistance conditioning means converts resistance to electrical voltage, a means for connecting the resistance conditioning means to a comparator means, and a means for connecting said comparator means to a memory means;

the comparator means comprises:

a temperature stable voltage reference means, a means for coupling said temperature stable voltage reference means to a high reference voltage means and to a low reference voltage means, a means for coupling said high reference voltage means to a high comparator means, and a means for coupling said high comparator means to a high temperature visual indicator means;

a means for coupling said low reference voltage means to a low comparator means, and a means for coupling said low comparator means to a low temperature visual indicator means, a means for coupling the high comparator means and the low comparator means to an electrical AND circuit means, and a means for coupling said electrical AND circuit means to an output;

a means for coupling the high comparator means and the low comparator means to an input protection means, and a means of coupling said input protection means to an input, and a means of coupling said input to the resistance conditioning means;

whereby when said input has a higher voltage signal present than that of the high reference voltage means the high temperature visual indicator illuminates, and the signal present at said output is a logic LOW;

whereby when said input has a lower voltage signal present than that of the low reference voltage means the low temperature visual indicator illuminates, and the signal present at the output is a logic LOW;

whereby when said input has a voltage signal present that is less than the high reference voltage means and greater than the low reference voltage means neither the high temperature visual indicator nor the low temperature visual indicator illuminates and the signal at the output is a logic HIGH;

said memory means comprises:

a latching memory means having a first input for setting said latching memory means, a second input for resetting the latching memory means, and a digital output means;

a means for connecting said first input to a protection means so as to protect the latching memory means from high voltages that could accidentally be present at said unit under test, a means for coupling said protection means to said output of the comparator means;

a means for connecting said digital output means to a visual indicator means, and to an audio indicator enabling-disabling means, and to a variable time delay means, and to an external output means;

whereby when the digital output means is a digital logic HIGH said visual indicator means illuminates;

a means for coupling said variable time delay means to an automatic reset means;

a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:

a means for resetting said latching memory means, and a means for flashing said visual indicator means;

a means for coupling said audio indicator enabling-disabling means to an audio indicator means which has a means for varying audio frequency;

whereby when the digital output means changes from a digital logic LOW to a logic HIGH the variable time delay means commences a timing sequence such that at the end of a user adjustable time interval the automatic reset means begins to produce pulses, said pulses are used to reset the latching memory means;

whereby when the digital logic output means is a logic HIGH and the audio indicator enabling-disabling means is in an enabling mode said audio indicator means produces a audio tone of adjustable frequency;

whereby when the signal present at the first input means is a continuous logic LOW the latching memory means is in a set condition and when the second input means receives reset pulses from the automatic reset means after a variable time delay, the latching memory means continues to remain in said set condition and the visual indicator means flashes and said audio indicator tone warbles.

8. A light sensing circuit that detects intermittent illumination, light, changes or continuous illumination that is higher or lower than preset thresholds, such that when the illumination to be measured is outside a window of said preset thresholds, a plurality of visual indicators and a defeatable audio indicator are activated;

said light sensing circuit comprises:

a light sensing element, whereby said light sensing element converts light to resistance, and a means for coupling the light sensing element to a resistance conditioning means, whereby said resistance conditioning means converts resistance to electrical voltage, a means for connecting the resistance conditioning means to a comparator means, and a means for connecting said comparator means to a memory means;

the comparator means comprises:

a temperature stable voltage reference means, a means for coupling said temperature stable voltage reference means to a high reference voltage means and to a low reference voltage means, a means for coupling said high reference voltage means to a high comparator means, and a means for coupling said high comparator means to a high illumination visual indicator means;

a means for coupling said low reference voltage means to a low comparator means, and a means for coupling said low comparator means to a low illumination visual indicator means, a means for coupling the high comparator means and the low comparator means to an electrical AND circuit means, and a means for coupling said electrical AND circuit means to an output;

a means for coupling the high comparator means and the low comparator means to an input protection means, and a means of coupling said input protection means to an input, and a means of coupling said input to the resistance conditioning means;

whereby when said input has a higher voltage signal present than that of the high reference voltage means the high illumination visual indicator illuminates, and the signal present at said output is a logic LOW;

whereby when said input has a lower voltage signal present than that of the low reference voltage means the low illumination visual indicator illuminates, and the signal present at the output is a logic LOW;

whereby when said input has a voltage signal present that is less than the high reference voltage means and greater than the low reference voltage means neither the high illumination visual indicator nor the low illumination visual indicator illuminates and the signal at the output is a logic HIGH;

said memory means comprises:

a latching memory means having a first input for setting said latching memory means, a second input for resetting the latching memory means, and a digital output means;

a means for connecting said first input to a protection means, a means for coupling said protection means to said output of the comparator means;

a means for connecting said digital output means to a visual indicator means, and to an audio indicator enabling-disabling means, and to a variable time delay means, and to an external output means;

whereby when the digital output means is a digital logic HIGH said visual indicator means illuminates;

a means for coupling said variable time delay means to an automatic reset means;

a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:

a means for resetting said latching memory means, and a means for flashing said visual indicator means;

a means for coupling said audio indicator enabling-disabling means to an audio indicator means which has a means for varying audio frequency;

whereby when the digital output means changes from a digital logic LOW to a logic HIGH, the variable time delay means commences a timing sequence such that at the end of a user adjustable time interval the automatic reset means begins to produce pulses, said pulse are used to reset the latching memory means;

whereby when the digital logic output means is a logic HIGH and the audio indicator enabling-disabling means is in an enabling mode said audio indicator means produces a audio tone of adjustable frequency;

whereby when the signal present at the first input means is a continuous logic LOW the latching memory means is in a set condition and when the second input means receives reset pulses from the automatic reset means after a variable time delay, the latching memory means continues to remain in said set condition and the visual indicator means flashes and said audio indicator tone warbles.

9. A multi-function test circuit which detects, electrical continuity for open or closed circuits; direct current power interruptions; alternating current power interruptions or decrease in alternating current frequency; missing pulses; and voltages, or resistances, or currents that are greater than or less than preset high and low limits; and whereby provides a plurality of visual indications and a defeatable audio indication that an intermittent of continous fault has been detected;

said multi-function test circuit comprises:

a terminal means for coupling the multi-function test circuit to units under test, and a means for coupling said terminal means to a first switching means such as to selectively select a continuity detector, an AC and DC power detector, a missing pulse detector, a voltage conditioning means, a resistance conditioning means, or a direct current conditioning means;

a second switching means for selectively coupling said voltage conditioning means or said resistance conditioning means, or said direct current conditioning means to a voltage comparator means;

a third switching means for selective coupling said continuity detector, said AC and DC power detector, said missing pulse detector, and said voltage comparator means to a memory means; said first, second, and third switching means are mechanically coupled together.

10. In the multi-function test circuit of claim 9 wherein the memory means comprises:

a latching memory means having a first input for setting said latching memory means, a second input for resetting the latching memory means, and digital output means;

a means for connecting said first input to a protection means so as to protect the latching memory means from high voltages that could accidentally be present at said unit under test; a means for connecting said digital output means to a visual indicator means, and to an audio indicator enabling-disabling means, and to a variable time delay means, and to an external output means;

whereby when the digital output means is a digital logic HIGH said visual indicator means illuminates;

a means for coupling said variable time delay means to an automatic reset means;

a manual reset means, and a means for coupling said second input means to a means for selectively selecting either said manual reset means or said automatic reset means; a means for coupling the manual reset means, and the automatic reset means to said means for selectively selecting either the manual reset means or the automatic reset means;

said automatic reset means comprises:

a means for resetting said latching memory means, and a means for flashing said visual indicator means;

a means for coupling said audio indicator enabling-disabling means to an audio indicator means which has a means for varying audio frequency;

whereby when the digital output means changes from a digital logic LOW to a logic HIGH, the variable time delay means commences a timing sequence such that at the end of a user adjustable time interval the automatic reset means begins to produce pulses, said pulses are used to reset the latching memory means;

whereby when the digital logic output means is a logic HIGH and the audio indicator enabling-disabling means is in an enabling mode said audio indicator means produces a audio tone of adjustable frequency;

whereby when the signal present at the first input means is a continuous logic LOW, the latching memory means is in a set condition, and when the second input means receives reset pulses from the automatic reset means after a variable time delay, the latching memory means continues to remain in said set condition and the visual indicator means flashes and said audio indicator tone warbles.

11. In the multi-function test circuit of claim 9 wherein the comparator means comprises:
a temperature stable voltage reference means, a means for coupling said temperature stable voltage reference means to a high reference voltage means and to a low reference voltage means, a means for coupling said high reference voltage means to a high comparator means, and a means for coupling said high comparator means to a high visual indicator means;

a means for coupling said low reference voltage means to a low comparator means, and a means for coupling said low comparator means to a low visual indicator means, a means for coupling the high comparator means and the low comparator means to an electrical AND circuit means, and a means for coupling said electrical AND circuit means to an output;

a means for coupling the high comparator means and the low comparator means to an input protection means, and a means for coupling said input protection means to an input, and a means for coupling said input to the current conditioning means;

whereby when said input has a higher voltage signal present than that of the high reference voltage means the high visual indicator illuminates, and the signal present at said output is a logic LOW;

whereby when said input has a lower voltage signal present than that of the low reference voltage means the low visual indicator illuminates, and the signal present at the output is a logic LOW;

whereby when said input has a voltage signal present that is less than the high reference voltage means and greater than the low reference voltage means neither the high visual indicator nor the low visual indicator illuminates and the signal at the output is a logic HIGH;

12. In the multi-function test circuit of claim 9 wherein said missing pulse detector comprises of a capacitor, a variable resistor, and a diode.

13. In the multi-function test circuit of claim 9 wherein the AC and DC Power Detector comprises:
a DC power detector means, and an AC power detector means;
said DC detector means comprises:
a rectifier means, and a means for coupling said rectifier means to said switching means and a means for coupling the rectifier means to a current regulating means, and a means for coupling said current regulating circuit to an optical isolation means and a means for coupling said optical isolation means to an output;
whereby the rectifier means protects the current regulating means from high voltages of reversed polarity derived from the units under test; and the current regulator means provides a near uniform current to the optical isolation means, and the optical isolator means is so configured such that said output is a first predetermined output if DC power of proper polarity is present, and a second predetermined output if no DC power is present or is of reversed polarity;
said AC power detector means comprises:
a rectifier means, and a means for coupling said rectifier means to said units under test, and a means for coupling the rectifier means to a current regulating means, and a means for coupling said current regulating circuit to an optical isolation means and a means for coupling said optical isolation means to a fast charge slow discharge integration means, and a means for coupling said fast charge slow discharge integration means to an output;
whereby the rectifier means produces full wave rectified current derived from AC at the units under test; and the current regulator means provides a pulsing DC, limited so as not to exceed the capacity of the optical isolation means, and the optical isolator means and fast charge slow discharge integration means is so configured such that said output is a first predetermined output if AC power of proper frequency is present, and a second predetermined output if no AC power is present or is of a decreased frequency.

14. In the multi-function test circuit of claim 9 wherein said resistance conditioning means comprises:
a plurality of resistors, and a multipole multiposition switch, a current source, and a voltage output;
whereby the resistance conditioning means converts resistance to voltage in accordance with Ohms Law which is: $E = IR$.

15. In the multi-function test circuit of claim 9 wherein the direct current conditioning means comprises:
a plurality of current shunting resistors, and a multipole multiposition switch and a voltage output; a means for coupling said plurality of current shunting resistors with said multipole multiposition switch in such a manner that only one current shunting resistor is electrically connected in a circuit or the plurality of current shunting resistors are electrically connected in series, and a means for coupling the multipole multiposition switch to said output such that the output is a voltage that is directly proportional to the current through one current shunting resistor, when the multipole multiposition switch is in a first position; or directly proportional to the current through said serially connected plurality of current shunting resistors, when the multipole multiposition switch is in other plural positions.

16. In the multi-function test circuit of claim 9 wherein the voltage conditioning means comprises:
   a means of attenuating a voltage received from said unit under
   test, by a plurality of selectable attenuation factors.

17. In the multi-function test circuit of claim 9 wherein the continuity detector comprises:
   a means for detecting open circuits, a means for detecting closed circuits, a means for selectively selecting either said means for detecting open circuits or said means for detecting closed circuits, a means for coupling said means for selectively selecting either the means for detecting open circuits or the means for detecting closed circuits to said units under test, and a means for selectively coupling either the means for detecting open circuits or the means for detecting closed circuits to an output, and a means for coupling said output to the memory means;
   whereby the output is a logic LOW signal when the unit under test is in a failed open state, or the output is a logic HIGH signal when the unit under test is in a non failed closed state, when the means for detecting open circuits is selected;
   whereby, likewise; the output is a logic LOW signal when the unit under test is in a failed closed state, or the output is a logic HIGH signal when the unit under test is in a non failed open state, when the means for detecting closed circuits is selected.

18. In the voltage comparator means of claims 4, 5, 6, 7, 8, or 11 the temperature stable voltage reference means comprises:
   a temperature stable voltage reference element, a resistor, and
   a means for buffering the output of said temperature stable voltage reference element; a means for coupling the temperature stable voltage, to said resistor, and to said buffering means, such that the buffering means is an amplifier means that prevents electrical loading of the temperature stable voltage reference element.

19. In the memory means of claims 1, 2, 3, 4, 5, 6, 7, 8, or 10 wherein the latching memory comprises:
   a plurality of dual input, high input impedance, NAND Schmitt trigger gates, and a means for operatively coupling said plurality of dual input, high input impedance, NAND Schmitt trigger gates such that a RESET-SET flip flop circuit is formed.

20. In the memory means of claims 1, 2, 3, 4, 5, 6, 7, 8, or 10 wherein the audio indicator comprises:
   a dual input, high input impedance, NAND Schmitt trigger gate, and a means for coupling said dual input, high input impedance, NAND Schmitt trigger gate to a capacitor, and a variable resistor, such as to form a variable frequency audio oscillator, and a means for coupling said audio oscillator to a piezo electric audio transducer.

21. In the memory means of claims 1, 2, 3, 4, 5, 6, 7, 8, or 10 wherein the variable time delay means comprises:
   a plurality of diodes, a resistor, a variable resistor, and a capacitor; said plurality of diodes are operatively coupled to said resistor, to said variable resistor, and to said capacitor, such that the capacitor slowly charges through the resistor, and a first diode, and the variable resistor; and discharges rapidly through the resistor and a second diode; whereby the resistor prevents said second diode from current overload during capacitor discharge.

22. In the memory means of claims 1, 2, 3, 4, 5, 6, 7, 8, or 10 wherein the automatic reset means comprises:
   a dual input, high input impedance, NAND Schmitt trigger gate; a resistor; and a capacitor; whereby said NAND Schmitt trigger gate is operatively coupled to said capacitor and said resistor such as to form a sub-audio frequency oscillator circuit.

* * * * *